US006713876B1

United States Patent
Vittu et al.

(10) Patent No.: US 6,713,876 B1
(45) Date of Patent: Mar. 30, 2004

(54) OPTICAL SEMICONDUCTOR HOUSING AND METHOD FOR MAKING SAME

(75) Inventors: Julien Vittu, Grenoble (FR); Remi Brechignac, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/129,372

(22) PCT Filed: Oct. 30, 2000

(86) PCT No.: PCT/FR00/03022

§ 371 (c)(1),
(2), (4) Date: Oct. 1, 2002

(87) PCT Pub. No.: WO01/33637

PCT Pub. Date: May 10, 2001

(30) Foreign Application Priority Data

Nov. 4, 1999 (FR) .............................................. 99 13779

(51) Int. Cl.[7] ................. H01L 31/0232; H01L 31/0203; H01L 29/40
(52) U.S. Cl. .................... 257/777; 257/693; 257/673; 257/432; 257/433
(58) Field of Search ................................ 257/693, 777, 257/787, 723, 724, 680, 698, 673, 432, 433, 434

(56) References Cited

U.S. PATENT DOCUMENTS 3,622,419 A * 11/1971 London .................... 257/434
5,867,368 A * 2/1999 Glenn ........................ 361/783
6,147,389 A * 11/2000 Stern et al. ................ 257/434
6,288,851 B1 * 9/2001 Tpmita ...................... 257/432
6,396,116 B1 * 5/2002 Kelly et al. ................ 257/432
6,495,895 B1 * 12/2002 Peterson et al. ............ 257/434
6,507,082 B2 * 1/2003 Thomas ..................... 257/414

FOREIGN PATENT DOCUMENTS

JP 2-278872 * 11/1990 .................. 257/434

* cited by examiner

Primary Examiner—Jasmine Clark
(74) Attorney, Agent, or Firm—Lisa K. Jorgenson; Jose Gutman; Fleit, Kain, Gibbons, Gutman, Bongini & Bianco P.L.

(57) ABSTRACT

Optical semiconductor package and process for fabricating an optical semiconductor package, in which an electrical connection support plate (2) has a through-passage (5); a first semiconductor component (4) such as a microprocessor placed behind the support plate and lying opposite the through-passage; electrical connection metal balls (9) inserted into the annular space separating the first component from the support plate; encapsulation mechanism including an encapsulation material (12) lying in the annular space; a second semiconductor component (13), a front face (15) of which has an optical sensor and a rear face of which is fixed to the front face (20) of the first component (4) through the through-passage (5) of the support plate (2); metal electrical connection wires (17) connecting the front face of the second component and the front face of the support plate; a front encapsulation lid (21) which covers the through-passage and the metal wires at some distance and which has at least one transparent part (23) lying in front of the optical sensor, and external electrical connection (25) located on an exposed part of the support plate.

18 Claims, 2 Drawing Sheets

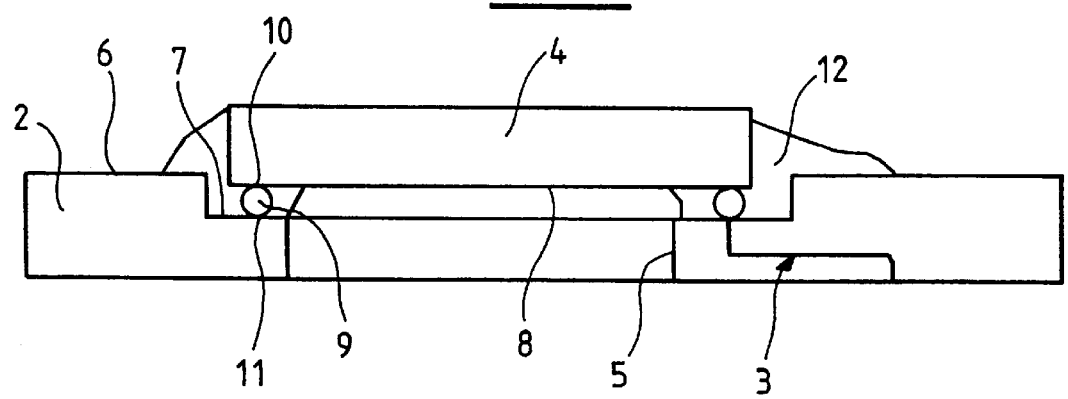
FIG_1
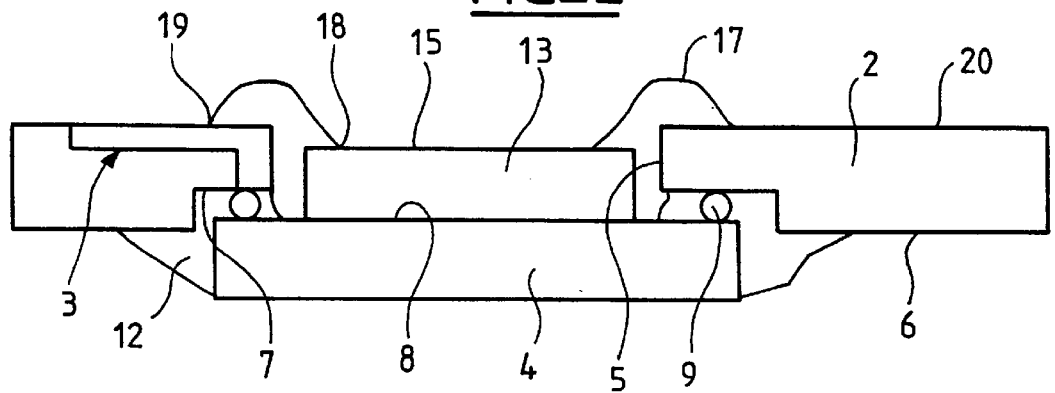
FIG_2
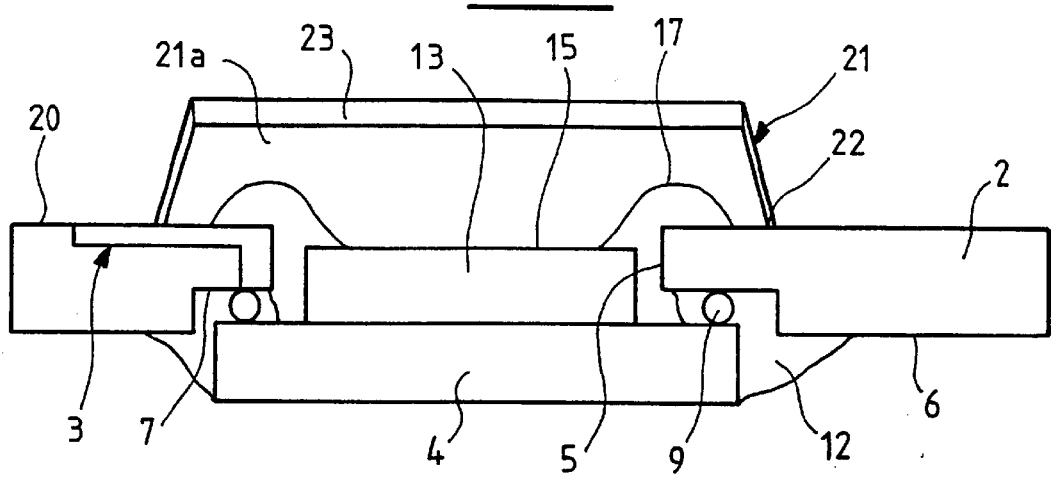
FIG_3

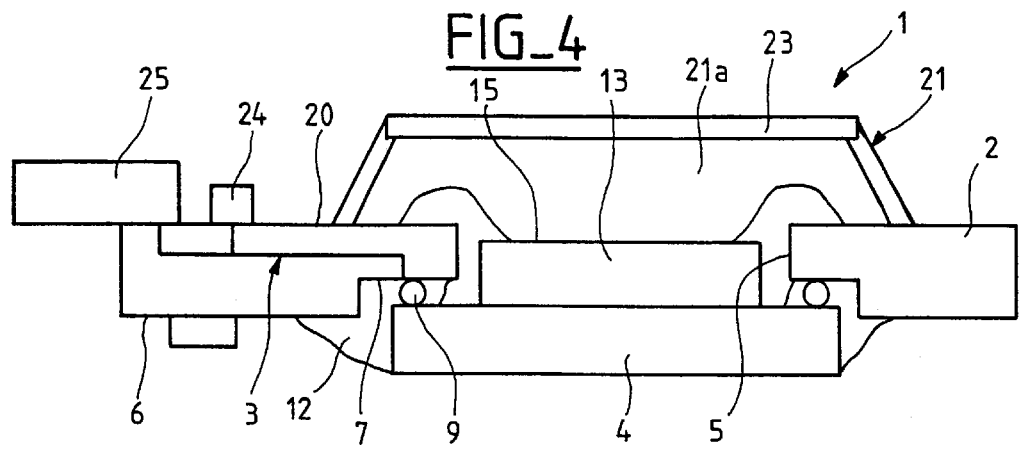
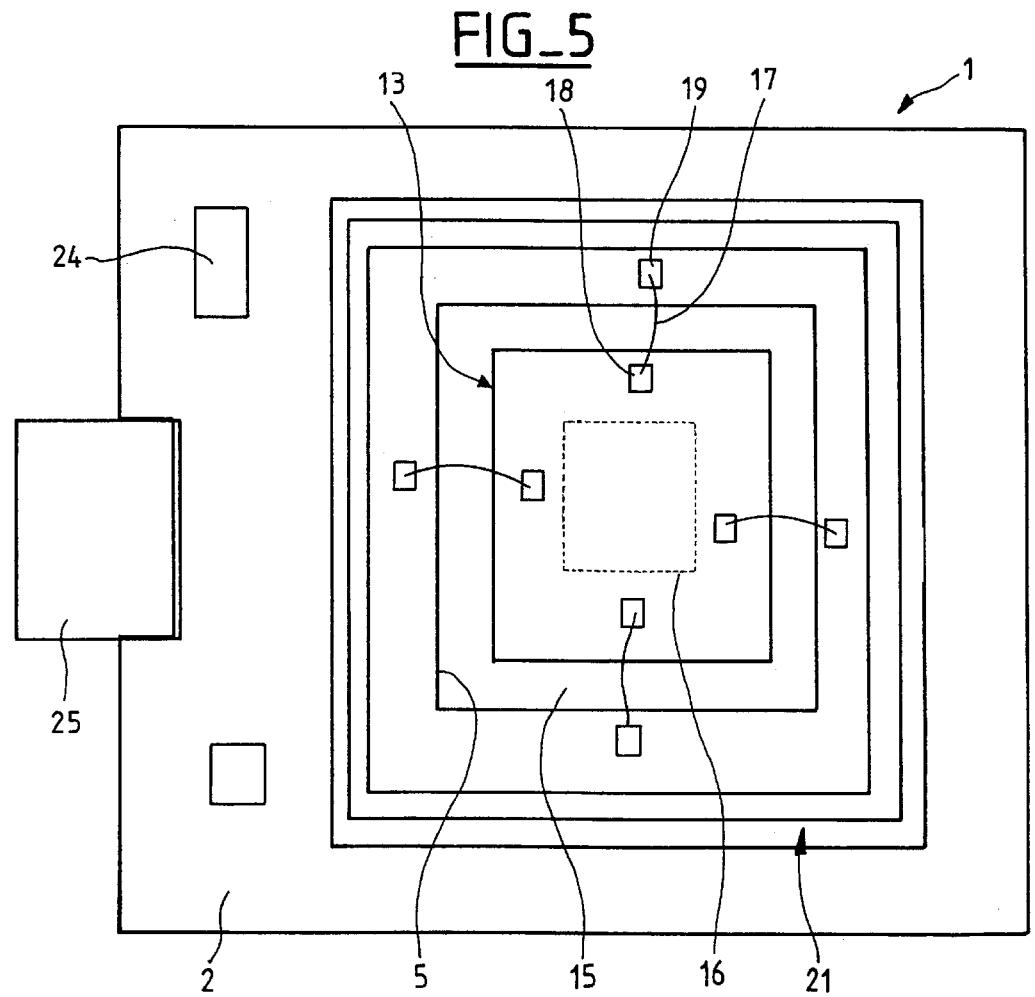

OPTICAL SEMICONDUCTOR HOUSING AND METHOD FOR MAKING SAME

CROSS-REFERENCE TO RELATED APPLICATIONS

This is the National Stage of International Application No. PCT/FR00/03022 filed on Oct. 30, 2000, which is based upon and claims priority from prior French Patent Application No. 9913779 filed Nov. 4, 1999, the entire disclosure of which is herein incorporated by reference.

BACKGROUND OF THE INVENTION

Field of the Invention

The present invention relates to an optical semiconductor package and to a process for fabricating such a package.

SUMMARY OF THE INVENTION

The object of the present invention is to provide a structure for an optical semiconductor package comprising several semiconductor components and a process for fabricating such a package in such a way that this package has a small footprint and is capable of being used immediately, preferably to deliver image data from the data arising from a semiconductor component with an optical sensor.

According to one subject of the invention, the optical semiconductor package comprises an electrical connection support plate having a through-passage; a first semiconductor component such as a microprocessor, placed behind the said support plate and lying opposite the said through-passage; electrical connection metal balls inserted into the annular space separating the said first component from the said support plate; encapsulation means comprising an encapsulation material lying in the said annular space; a second semiconductor component, a front face of which has an optical sensor and a rear face of which is fixed to the front face of the said first component through the said through-passage of the said support plate; electrical connection metal wires connecting the front face of the said second component and the front face of the said support plate; a front encapsulation lid which covers the said through-passage and the said metal wires at some distance and which has at least one transparent part lying in front of the said optical sensor; and external electrical connection means located on an exposed part of the said support plate.

According to the invention, the rear face of the said support plate preferably has an annular hollow surrounding the said through-passage, in which the said first component is engaged.

According to the invention, the package may advantageously comprise at least one passive component mounted on and connected to the said support plate.

According to the invention, the said external electrical connection means preferably comprise a connection body mounted on and connected to the said support plate.

According to another subject of the invention, the process for fabricating an optical semiconductor package consists in fixing and electrically connecting the front face of a first semiconductor component such as a microprocessor behind a through-passage of an electrical connection support plate, via electrical connection metal balls inserted into the annular space separating the said first component from the said support plate; encapsulating the said first component using an encapsulation material lying at least in the said annular space; fixing a rear face of a second semiconductor component to the front face of the said first component through the said through-passage of the said support plate, a front face of the said second component having an optical sensor; electrically connecting the front face of the said second component and the front face of the said support plate via electrical connection metal wires; and encapsulating the said second component and the said metal wires on the front face of the said support plate and having at least one transparent part lying in front of the said optical sensor.

According to the invention, the process preferably consists in encapsulating the said second component and the said metal wires inside a front lid.

According to the invention, the process preferably consists in fixing and electrically connecting at least one external electrical connection element to an exposed part of the said support plate.

According to the invention, the process preferably consists in fixing and electrically connecting at least one passive component to the said support plate.

BRIEF DESCRIPTION OF THE INVENTION

The present invention will be better understood by studying an optical semiconductor package and its fabrication process, described by way of non-limiting examples and illustrated by the drawing in which:

FIG. 1 shows a side view of a first stage in the fabrication of a package according to the present invention;

FIG. 2 shows a second stage in the fabrication of the said package;

FIG. 3 shows a third stage in the fabrication of the said package;

FIG. 4 shows a fourth stage in the fabrication of the said first package; and

FIG. 5 shows a top view of the said package according to FIG. 4.

DETAILED DESCRIPTION THE PREFERRED EMBODIMENTS

The various stages in the fabrication of an optical semiconductor package, denoted overall by the reference 1 and shown completed in FIGS. 4 and 5, will now be described with reference to FIGS. 1 to 5.

FIG. 1 shows a prefabricated substrate 2 formed by a support plate which has internal and/or external lines forming an electrical connection network 3 and shows a first semiconductor component 4 such as a microprocessor or coprocessor.

The support plate 2 has a through-passage 5 and, in its rear face 6, an annular hollow or countersink 7 surrounding the through-passage 5.

In a first stage of fabrication, the front face 8 of the component 4 is fixed and electrically connected to the bottom of the annular hollow 7 via a multiplicity of distributed metal balls 9 which are inserted between, on the one hand, metal connection pads 10 made on the surface on the front face 8 of the component 4 and, on the other hand, metal connection pads 11 made on the surface at the bottom of the hollow 7 and connected to the network 3. In this assembled position, the component 4 protrudes slightly into the hollow 7.

In a second stage of fabrication also shown in FIG. 1, the component 4 on the rear face 6 of the support plate 2 is encapsulated, by filling the annular space separating the front face 8 of the component 4 and the rear face 6 of the support plate 2 with an encapsulating and sealing material 12 in which the metal connection balls 9 are embedded.

In a third stage of fabrication shown in FIG. 2, the rear face of the second semiconductor component 13 is fixed via a layer of adhesive to the front face 8 of the component 4 through the through-passage 5 of the support plate 2, the front face 15 of the component 13 having an optical sensor 16 in its central part.

The optical component 13 is then electrically connected to the electrical connection network 3 of the support plate 2 by fixing one of the ends of electrical connection wires 17 to metal pads 18 formed on the surface on the front face 45 on the optical component 4, around its optical sensor 16, and by fixing the other end of the electrical connection wires 17 to metal pads 19 of the network 3, these being formed on the surface on the front face 20 of the support plate 2, around its through-passage 5.

In a fourth stage of fabrication shown in FIG. 3, a front encapsulation is carried out by positioning a dish-shaped lid 21, defining a cavity 21a, above and some distance from the optical component 13 and the electrical connection wires 17, the peripheral edge 22 of the said lid being adhesively bonded to the front face 20 of the support plate 1, some distance from pads 19. This lid has a bottom 23 made from a transparent material which lies parallel to the front face 15 of the optical component 13.

In a fifth stage of fabrication shown in FIG. 4, passive electronic components 24, such as resistors and/or capacitors, are fixed to the exposed part of the front face 20 of the support plate 2, laterally with respect to the lid 21, and/or on the exposed part of the rear face 6 of the support plate 2, laterally with respect to the component 4, these electronic components 22 being at the same time electrically connected to the connection network 3 of the support plate 2.

An external electrical connection body or connector 25 is then fixed to the end of an exposed part of the support plate 2, this body 25 being at the same time electrically connected to the connection network 3 of the support plate 2.

In this way, as shown in FIGS. 4 and 5, a complete optical semiconductor package 1 is obtained, fitted with an optical semiconductor component 13 and with various electronic processing components 4 and 22, electrically connected in an appropriate way via the electrical connection network 3 of the support plate 2 and capable of being connected to an external circuit using the electrical connector 25.

The present invention is not limited to the example described hereinbefore. Many alternative embodiments are possible without departing from the framework defined by the appended claims.

What is claimed is:

1. An optical semiconductor package comprising:
    an electrical connection support plate having a through-passage;
    a first semiconductor component such as a microprocessor, placed behind the support plate and lying opposite the through-passage;
    electrical connection metal balls inserted into the annular space separating the first semiconductor component from the support plate;
    encapsulation means comprising an encapsulation material lying in the annular space;
    a second semiconductor component, a front face of which has an optical sensor and a rear face of which is fixed to the front face of the first component through the through-passage of the support plate;
    metal electrical connection wires connecting the front face of the second component and the front face of the support plate;
    a front encapsulation lid which covers the through-passage and the metal wires at some distance and which has at least one transparent part lying in front of the optical sensor; and
    external electrical connection means located on an exposed part of the support plate.

2. The optical semiconductor package according to claim 1, further comprising at least one passive component, mounted on and connected to the support plate.

3. The optical semiconductor package according to claim 1, wherein the external electrical connection means comprises a connection body, mounted on and connected to the support plate.

4. The optical semiconductor package according to claim 1, wherein the rear face of the support plate has an annular hollow surrounding the through-passage, in which the first component is engaged.

5. The optical semiconductor package according to claim 4, wherein the external electrical connection means comprises a connection body, mounted on and connected to the support plate.

6. The optical semiconductor package according to claim 4, further comprising at least one passive component, mounted on and connected to the support plate.

7. The optical semiconductor package according to claim 6, wherein the external electrical connection means comprises a connection body, mounted on and connected to the support plate.

8. A method for fabricating an optical semiconductor package, the method comprising:
    fixing and electrically connecting the front face of a first semiconductor component such as a microprocessor behind a through-passage of an electrical connection support plate, via electrical connection metal balls inserted into the annular space separating the first semiconductor component from the support plate;
    encapsulating the first semiconductor component using an encapsulation material lying at least in the annular space;
    fixing a rear face of a second semiconductor component to the front face of the first semiconductor component through the through-passage of the support plate, a front face of the second semiconductor component having an optical sensor;
    electrically connecting the front face of the second optical component and the front face of the support plate via electrical connection metal wires; and
    encapsulating the second semiconductor component and the metal wires on the front face of the support plate inside a front lid and having at least one transparent part lying in front of the optical sensor.

9. The method according to claim 8, further comprising:
    fixing and electrically connecting at least one passive component to the support plate.

10. The method according to claim 8, further comprising:
    fixing and electrically connecting at least one external electrical connection body to an exposed part of the support plate.

11. The method according to claim 10, further comprising:
    fixing and electrically connecting at least one passive component to the support plate.

12. An information processing system comprising:
    at least one optical semiconductor package, each optical semiconductor package comprising:

an electrical connection support plate having a through-passage;

a first semiconductor component such as a microprocessor, placed behind the support plate and lying opposite the through-passage;

electrical connection metal balls inserted into the annular space separating the first semiconductor component from the support plate;

encapsulation means comprising an encapsulation material lying in the annular space;

a second semiconductor component, a front face of which has an optical sensor and a rear face of which is fixed to the front face of the first semiconductor component through the through-passage of the support plate;

metal electrical connection wires connecting the front face of the second semiconductor component and the front face of the support plate;

a front encapsulation lid which covers the through-passage and the metal wires at some distance and which has at least one transparent part lying in front of the optical sensor; and external electrical connection means located on an exposed part of the support plate.

13. The information processing system according to claim 12, wherein the optical semiconductor package further comprises at least one passive component, mounted on and connected to the support plate.

14. The information processing system according to claim 12, wherein the external electrical connection means comprises a connection body, mounted on and connected to the support plate.

15. The information processing system according to claim 12, wherein the rear face of the support plate has an annular hollow surrounding the through-passage, in which the first component is engaged.

16. The information processing system according to claim 15, wherein the external electrical connection means comprises a connection body, mounted on and connected to the support plate.

17. The information processing system according to claim 15, wherein the optical semiconductor package further comprises at least one passive component, mounted on and connected to the support plate.

18. The information processing system according to claim 17, wherein the external electrical connection means comprises a connection body, mounted on and connected to the support plate.

* * * * *